United States Patent
Kim et al.

(10) Patent No.: US 9,692,309 B1
(45) Date of Patent: Jun. 27, 2017

(54) AC POWER MONITORING AND PARAMETER DETERMINATION

(71) Applicant: Google Inc., Mountain View, CA (US)

(72) Inventors: Sangsun Kim, San Jose, CA (US); Eduardo M. Lipiansky, Danville, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 15/378,554

(22) Filed: Dec. 14, 2016

Related U.S. Application Data (63) Continuation of application No. 13/303,089, filed on Nov. 22, 2011, now Pat. No. 9,548,650.

(51) Int. Cl.

| | | |
|---|---|---|
| G01R 21/00 | (2006.01) | |
| H02M 5/04 | (2006.01) | |
| H02M 1/12 | (2006.01) | |
| G01R 19/175 | (2006.01) | |
| G01R 31/42 | (2006.01) | |
| G01R 19/25 | (2006.01) | |

(52) U.S. Cl.
CPC ............ *H02M 5/04* (2013.01); *G01R 19/175* (2013.01); *G01R 19/2513* (2013.01); *G01R 21/006* (2013.01); *G01R 31/42* (2013.01); *H02M 1/12* (2013.01)

(58) Field of Classification Search
CPC .......... H02M 1/12; H02M 1/42; H02M 1/083; G01R 19/175; G01R 21/00
USPC .......................................................... 702/60
See application file for complete search history.

(56) References Cited

U.S. PATENT DOCUMENTS

| | | |
|---|---|---|
| 5,519,311 A | 5/1996 | Widmayer |
| 7,609,008 B1 | 10/2009 | Kohler |
| 2004/0135719 A1 | 7/2004 | Richards et al. |
| 2008/0316779 A1 | 12/2008 | Jayaraman et al. |
| 2009/0040665 A1 | 2/2009 | Elms et al. |
| 2011/0273098 A1 | 11/2011 | Grajcar |

(Continued)

OTHER PUBLICATIONS

Sangsun Kim. Harmonic Reference Current Generation for Unbalanced Nonlinear Loads. IEEE 2003. pp. 773-778.

(Continued)

*Primary Examiner* — Gregory J Toatley
*Assistant Examiner* — Yoshihisa Ishizuka
(74) *Attorney, Agent, or Firm* — Fish & Richardson P.C.

(57) ABSTRACT

Devices and methods for monitoring and determining alternating current (AC) power system parameters are provided. In some implementations, the device can include a processor; and at least one non-transitory computer-readable medium storing computer-executable instructions for implementing a number of components. The components include a monitor configured to: sense an AC line voltage signal and an AC current voltage signal; filter the AC line voltage signal; calculate average AC line voltage and current values based, at least, on a DC voltage and current values corresponding to the AC line voltage and current signals, respectively; determine fundamental AC line voltage and current signals based, at least, on zero crossings of the respective average AC line voltage value and the average AC line current value; and determine one or more AC power system parameters based, at least, on the fundamental AC line voltage signal and the fundamental AC line current signal.

20 Claims, 7 Drawing Sheets

(56) References Cited

U.S. PATENT DOCUMENTS

2012/0262947 A1    10/2012    Wang

OTHER PUBLICATIONS

Fatih Basciftci, Scientific Research and Essays vol. 5 (16) pp. 2312-2317, Aug. 18, 2010.
Abb Sage. Technical Application Papers No. 8 Power factor correction and harmonic filtering in electrical plants, 201 O.
Mehta, V.K., Basic Electrical Engineering. S.Chand & Company LTD, 2008. p. 533.

AC POWER MONITORING AND PARAMETER DETERMINATION

I. CROSS-REFERENCE TO RELATED APPLICATIONS

This application is a continuation application of, and claims priority to, U.S. patent application Ser. No. 13/303,089, titled "AC Power Monitoring And Parameter Determination," filed on Nov. 22, 2011. The disclosure of the foregoing application is incorporated herein by reference in its entirety for all purposes.

II. FIELD

The following description relates to alternating current (AC) power systems, in general, and to monitoring and determining AC power system parameters, in particular.

III. BACKGROUND

Data centers are responsible for reliably storing and providing data worldwide. Data centers perform such functions via servers, computers and other electrical devices communicatively coupled to one another. As such, monitoring the electrical power utilized or allocated within a data center is of vital importance. Data center-level or circuit level decision-making can be performed as a result of the monitoring, and policy decisions can be formed that are then propagated down to power supplies for the data center. However, in existing AC power monitoring systems, complex Fast Fourier Transforms (FFTs) are employed by processors to facilitate monitoring and determination of AC power system parameters. Unfortunately, these processors are expensive and FFT processing results in significant delay with regard to parameter calculation. Accordingly, devices, circuitry and methods for monitoring and determining AC power system parameters while foregoing the use of FFTs, are desirable.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its purpose is to present some concepts of one or more implementations in a simplified form as a prelude to the more detailed description that is presented later.

In one or more implementations, the disclosed subject matter relates to a device that includes a processor; and at least one non-transitory computer-readable medium. The computer-readable medium can be communicatively coupled to the processor, and store computer-executable instructions for implementing at least one of a number of components. The components include an AC power system monitor configured to: sense an AC line voltage signal and an AC line current signal; filter the AC line voltage signal and remove one or more harmonic frequencies of the AC line voltage signal; calculate a direct current (DC) voltage value based, at least, on the filtered AC line voltage signal; calculate a DC current value based, at least, on the AC line current signal; calculate an average filtered AC line voltage value and an AC line current value based, at least, on the DC voltage value and the DC current value; determine a fundamental AC line voltage signal and a fundamental AC line current signal based, at least, on one or more zero crossings of the respective average filtered AC line voltage value and the average AC line current value; and determine one or more AC power system parameters based, at least, on the fundamental AC line voltage signal and the fundamental AC line current signal.

In another implementation, the disclosed subject matter also relates to a method. The method can include employing at least one processor executing computer-executable instructions embodied on at least one non-transitory computer-readable medium. The computer-executable instructions can be embodied on the computer-readable medium to perform operations including: filtering an AC line voltage signal and removing one or more harmonic frequencies of the AC line voltage signal; calculating a DC voltage value based, at least, on the filtered AC line voltage signal; calculating a DC current value based, at least, on an AC line current signal; calculating an average filtered AC line voltage value and an AC line current value based, at least, on the DC voltage value and the DC current value; determining a fundamental AC line voltage signal and a fundamental AC line current signal based, at least, on one or more zero crossings of the respective average filtered AC line voltage value and the average AC line current value; and determining one or more AC power system parameters based, at least, on the fundamental AC line voltage signal and the fundamental AC line current signal.

In another implementation, the disclosed subject matter relates to another method. The method can include employing at least one processor executing computer-executable instructions embodied on at least one non-transitory computer-readable medium. The computer-executable instructions can be embodied on the computer-readable medium to perform operations including: determining a total harmonic distortion (THD) of the AC system based, at least, on a fundamental AC line voltage signal and a fundamental AC line current signal; and re-computing the total harmonic distortion at approximately every half AC cycle.

Toward the accomplishment of the foregoing and related ends, the one or more implementations include the features hereinafter fully described and particularly pointed out in the claims. The following description and the annexed drawings set forth herein detail certain illustrative aspects of the one or more implementations. These aspects are indicative, however, of but a few of the various ways in which the principles of various implementations can be employed, and the described implementations are intended to include all such aspects and their equivalents.

DETAILED DESCRIPTION

Various implementations are now described with reference to the drawings, wherein like reference numerals are used to refer to like elements throughout. In the following description, for purposes of explanation, numerous specific details are set forth in order to provide a thorough understanding of one or more implementations. It can be evident, however, that such implementations can be practiced without these specific details. In other instances, well-known structures and devices are shown in block diagram form in order to facilitate describing one or more implementations.

As used in this application, the terms "device," "component," "module," "system," and the like are intended to refer to a computer-related entity, either hardware, software, firmware, a combination of hardware and software, software and/or software in execution. In various implementations, hardware can include, but is not limited to, circuitry for performing one or more functions described herein. For example, a component can be, but is not limited to being, a process running on a processor, a processor, an object, an executable, a thread of execution, a program, and/or a computer. By way of illustration, both an application running on a computing device and/or the computing device can be a component. One or more components can reside within a process and/or thread of execution and a component can be localized on one computer and/or distributed between two or more computers. In addition, these components can execute from various computer-readable storage media having various data structures stored thereon. The components can communicate by way of local and/or remote processes such as in accordance with a signal having one or more data packets (e.g., data from one component interacting with another component in a local system, distributed system, and/or across a network such as the Internet with other systems by way of the signal).

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Figure 1:
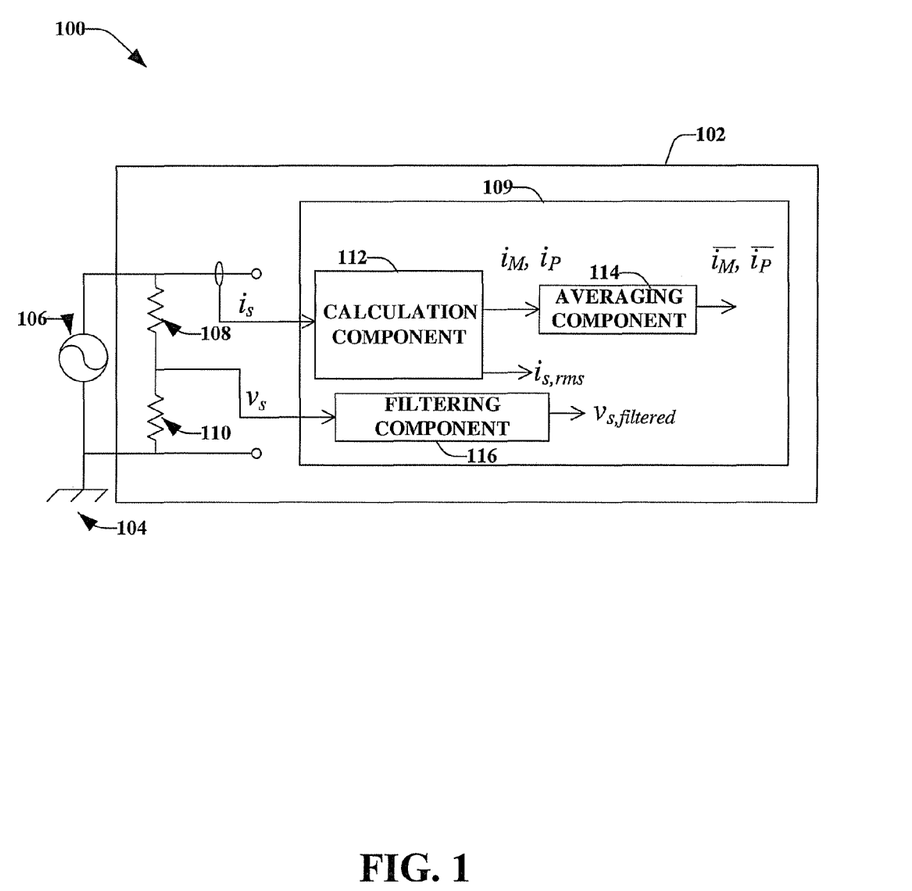
FIG. 1 is an illustration of a block diagram of an exemplary non-limiting device configured to facilitate AC power system monitoring and parameter determination according to implementations described herein.

FIG. 1 is an illustration of a block diagram of an exemplary non-limiting device configured to facilitate AC power system monitoring and parameter determination according to implementations described herein. The device 102 can include resistors 108, 110 and a microcontroller 109. The microcontroller 109 can include a calculation component 112, a filtering component 116, and an averaging component 114. The resistors 108, 110 and microcontroller 109 (and/or components thereof) can be electrically and/or communicatively coupled to one another to perform one or more functions of device 102. Device 102 can be communicatively coupled to AC power supply 106. As such, the device 102 can perform monitoring and parameter determination for an AC power system for which electrical power is provided by the AC power supply 106.

As shown in FIG. 1, AC line voltage, $v_s$, and AC line current, $i_s$, can be sensed by microcontroller 109. The AC line voltage, $v_s$, can contain harmonic frequencies and, as such, $v_s$, can be filtered with filtering component 116. The filtering component can be a low pass filter (LPF) in some implementations. In other implementations, any filter configured to filter out harmonic frequencies can be employed.

The filtering component 116 can substantially remove the harmonic frequencies by low pass filtering the AC line voltage signal such that only the signal with fundamental frequency remains and the signals with harmonic frequencies are substantially removed. The filtered AC line voltage, $v_{s,filtered}$ can be output from the filtering component 116 as shown in FIG. 1.

Figure 2:
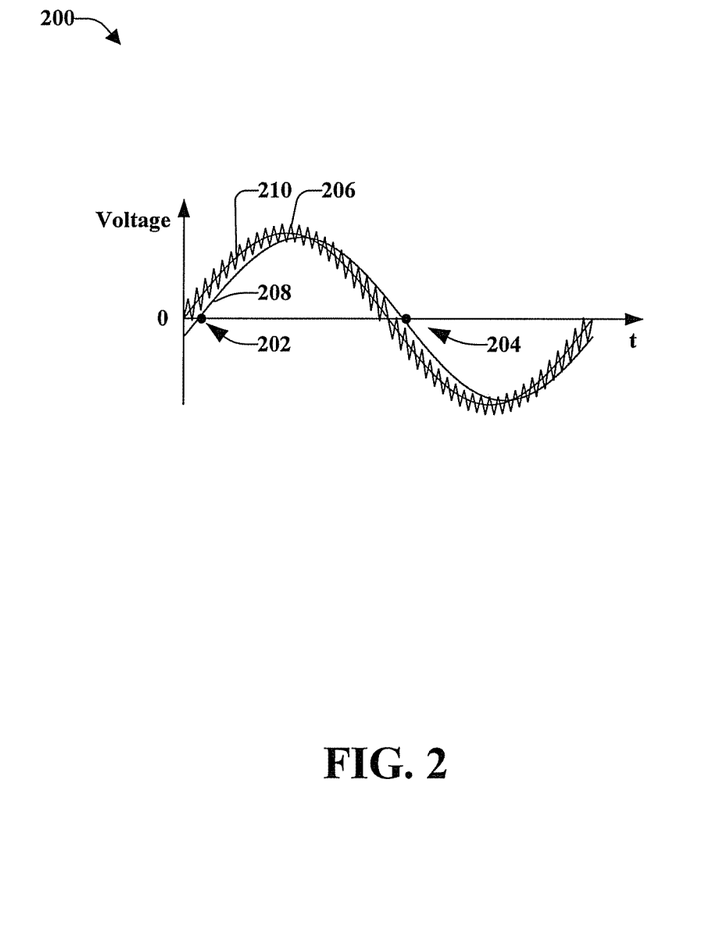
FIG. 2 is an illustration of a graph depicting AC line voltage waveforms for facilitating AC power system monitoring and parameter determination according to implementations described herein.

One or more functions of the microcontroller 109 and the filtering component 116 can be illustrated with reference to FIG. 2. FIG. 2 is an illustration of a graph depicting AC line voltage waveforms for facilitating AC power system monitoring and parameter determination according to implementations described herein.

The AC line voltage signal $v_s$, corresponds to reference numeral 206, the filtered AC line voltage signal, $v_{s,filtered}$, corresponds to 208, and the fundamental AC line voltage signal, $v_{s1}$, corresponds to 210. The zero crossings correspond to reference numerals 202, 204.

As shown in FIG. 2, the AC line voltage $v_s$, 206 can be sensed, and the filtered AC line voltage, $v_{s,filtered}$, 208 can be output. The filtered AC line voltage, $v_{s,filtered}$, 208 can cross the zero axis at zero crossings 202, 204, as shown. The fundamental frequency, f, can be determined based on the zero crossings. Additionally, the angular position, $\theta_v = 2\pi f \cdot t$ of the filtered AC line voltage can be determined and updated every zero crossing of $v_{s,filtered}$. In various implementations, the device 102 can update AC data every half AC line cycle (e.g., every 8 to 10 milliseconds (msecs)). In the United States, the fundamental frequency can be at 60 Hertz (Hz), and in Europe, the fundamental frequency can be at 50 Hz.

Once the zero crossing times are determined, the filtered AC line voltage signal can be obtained that corresponds to the zero crossing location. The filtering component 116 can output an AC line voltage signal that includes the fundamental frequency, i.e., the fundamental voltage, $v_{s1}$. The fundamental voltage can be substantially without delay. Based, at least, on the fundamental voltage, $v_{s1}$, the average voltage and/or the average current can be calculated by providing the fundamental voltage and/or the fundamental current to the averaging component 114. Now, in lieu of performing signal processing using an FFT, averaging can be employed to enable determination of the AC power system parameters as shown in the Equations below.

Figure 3:
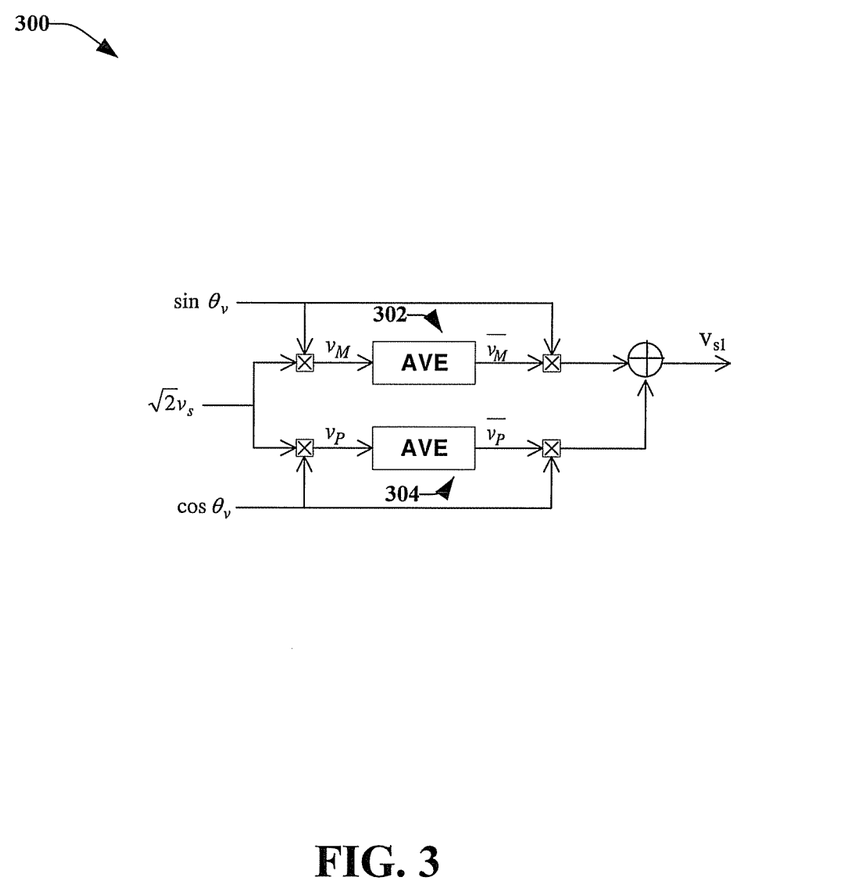
FIG. 3 is an illustration of an exemplary block diagram configured to calculate the fundamental voltage for facilitating AC power system monitoring and parameter determination according to implementations described herein.

FIG. 3 is an illustration of an exemplary block diagram configured to calculate the fundamental voltage for facilitating AC power system monitoring and parameter determination according to implementations described herein. As shown in FIG. 3, the fundamental voltage can be calculated as follows. The parameters $v_M$ and $v_P$ can be transformed from the AC voltage signals into substantially equivalent DC voltage values. In some embodiments, the parameters can be obtained in the block diagram in FIG. 3 according to the equations shown in Equations 1 and 2 below.

$$v_M = \sqrt{2}\, v_s \sin\theta_v \quad (1)$$

$$v_P = \sqrt{2}\, v_s \cos\theta_v \quad (2)$$

While not shown in FIG. 3, in some embodiments, prior to computing the average values, as noted above, the AC line voltage signals can be transformed into substantially equivalent DC values. Such values can then be averaged in the AVE 302, 304. The averages of $v_M$ and $v_P$ can be calculated at AVE 302, 304 as shown in Equations 3 and 4. In some embodiments, the average values can be DC values that are updated, for example, at one or more zero crossings. In some embodiments, one or more of the average values can be updated at every zero crossing. The value, $v_M$, can represent the portion of voltage associated with the active power, and the value, $v_P$, can represent the portion of voltage associated with the power factor angle between the voltage and the current. In applications in which the load is a 3-phase AC motor, M can represent torque component and P can represent flux component.

The average values $\overline{v_M}$ and $\overline{v_P}$ can be calculated and updated approximately every half AC line cycle according to the equations shown in Equations 3 and 4, where, n is the number of samples in a single AC cycle.

$$\overline{v_M} = \frac{1}{n}\sum_{i=1}^{n} v_M \quad (3)$$

$$\overline{v_P} = \frac{1}{n}\sum_{i=1}^{n} v_P \quad (4)$$

The averages can be added to calculate the fundamental voltage, $v_{s1}$.

As shown, the fundamental AC line voltage can be calculated from the averages. The angle, α, between the filtered AC line voltage and the fundamental AC line voltage, $v_{s1}$ can be calculated as shown in Equation 5.

$$\alpha = \tan^{-1}\left(-\frac{\overline{v_P}}{\overline{v_M}}\right) \quad (5)$$

The angular position $\theta_i = 2\pi f \cdot t$ of the fundamental AC line voltage can be obtained from α and can be used as a reference angular position for the AC line current.

The root mean square (RMS) fundamental AC line voltage can then be calculated as shown below with the RMS fundamental AC line voltage being calculated according to that shown in Equations 6 and 7.

$$V_{s,1} = \sqrt{\overline{v_M}^2 + \overline{v_P}^2} \quad (6)$$

$$V_{s,rms} = \frac{1}{n}\sqrt{\sum_{i=1}^{n} v_s^2} \quad (7)$$

Figure 4:
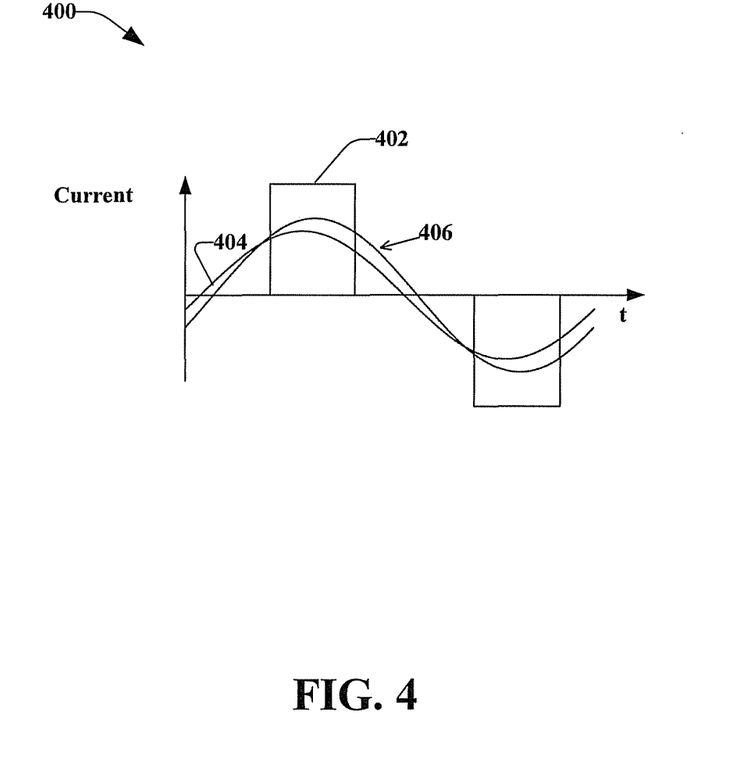
FIG. 4 is an illustration of a graph depicting AC line current waveforms for facilitating AC power system monitoring and parameter determination according to implementations described herein.

FIG. 4 is an illustration of a graph depicting AC line current waveforms for facilitating AC power system monitoring and parameter determination according to implementations described herein. The AC line current signal, $i_s$, corresponds to 402, the AC filtered voltage, $v_{s,filtered}$, corresponds to 404, and the AC fundamental current $i_{s1}$ corresponds to 406. The AC line fundamental current 406 needs to be determined.

Figure 5:
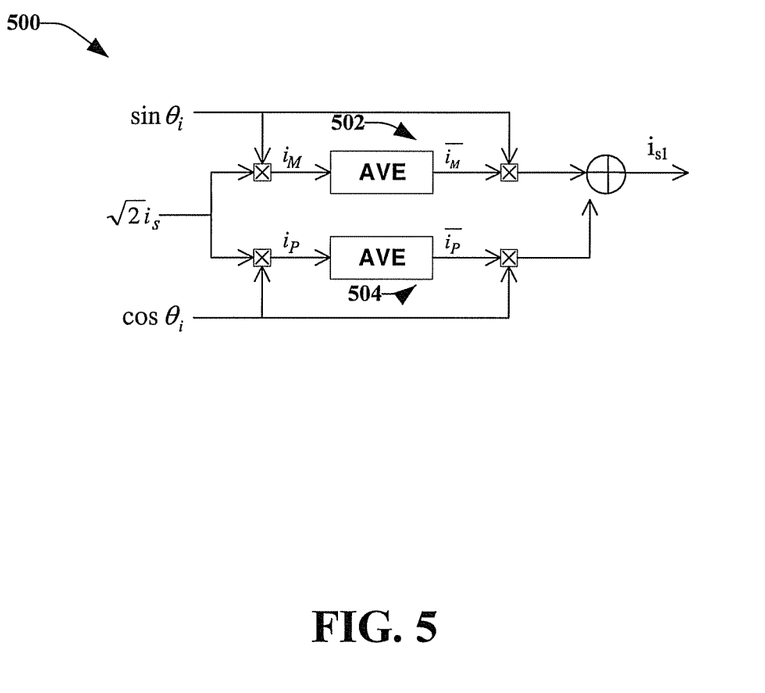
FIG. 5 is an illustration of an exemplary block diagram configured to calculate the fundamental current for facilitating AC power system monitoring and parameter determination according to implementations described herein.

FIG. 5 is an illustration of an exemplary block diagram configured to calculate the fundamental AC line current for facilitating AC power system monitoring and parameter determination according to implementations described herein. As shown in FIG. 5, the fundamental current can be calculated as follows. The parameters $i_M$ and $i_P$ can be transformed from the AC current signals into substantially equivalent DC current values. In some embodiments, the parameters can be obtained in the block diagram in FIG. 5 according to the equations shown in Equations 8 and 9 below, where sin $\theta_i$ is synchronized with the fundamental AC line voltage. While not shown in FIG. 5, in some embodiments, prior to computing the average values, as noted above, the AC line current signals can be transformed into substantially equivalent DC values. Such values can then be averaged as shown at 502, 504 of FIG. 5.

Specifically, the value $i_M$, can represent the portion of current associated with the active power, and the value, $i_P$, can represent the portion of current associated with the power factor angle between the voltage and the current.

$$i_M = \sqrt{2}\, i_s \sin\theta_i, \quad (8)$$

$$i_P = \sqrt{2}\, i_s \cos\theta_i. \quad (9)$$

The AVE values $\overline{i_M}$ and $\overline{i_P}$ are updated every half AC line cycle and can be calculated as shown in Equations 10 and 11.

$$\overline{i_M} = \frac{1}{n}\sum_{i=1}^{n} i_M, \quad (10)$$

$$\overline{i_P} = \frac{1}{n}\sum_{i=1}^{n} i_P. \quad (11)$$

In some embodiments, the average values are DC values. These values can be updated at one or more zero crossings. In some embodiments, the values are updated at every zero crossing. The power factor angle φ between the fundamental AC line voltage and fundamental AC line current can be calculated as shown at Equation 12.

$$\phi = \tan^{-1}\left(-\frac{\overline{i_P}}{\overline{i_M}}\right), \quad (12)$$

The RMS fundamental AC line current can be calculated as shown at Equation 13 and the RMS AC line current can be calculated as shown at Equation 14. The fundamental AC line current can be obtained without any delay.

$$I_{s,1} = \sqrt{\overline{i_M}^2 + \overline{i_P}^2}. \quad (13)$$

$$I_{s,rms} = \frac{1}{n}\sqrt{\sum_{i=1}^{n} i_s^2}. \quad (14)$$

The THD can be calculated as the ratio of the harmonic RMS value, $U_h$, and the fundamental value, $U_1$, of both voltage and current as shown in Equation 15, where $U_{s1}$ is either a power level of the fundamental AC line voltage or a power level of the fundamental AC line current, and $U_s$ is either a power level of the AC line voltage or a power level of the AC line current. The THD can be expressed as a percentage.

$$THD = \frac{\sqrt{U_s^2 - U_{s1}^2}}{U_{s1}^2} \times 100[\%] \quad (15)$$

Accordingly, as shown above, the need to perform an FFT to determine the U value is avoided and the U can be determined using an inexpensive microcontroller (that does not include FFT circuitry or software). The microcontroller can determine the fundamental AC line voltage and the fundamental AC line current, and correspondingly, the THD.

The PF and displacement PF (DPF) can be calculated according to the following Equations 16 and 17, where $\phi$ is the angle between the fundamental AC line voltage and the fundamental AC line current.

$$DPF = \cos\phi \quad (16)$$

$$PF = \frac{\text{Average power}}{\text{Apparent power}} = \frac{V_{s1}I_{s1}}{V_s I_s} DPF \quad (17)$$

Therefore, the fundamental AC line voltage, the fundamental AC line current and the THD. In various implementations, the DPF and the PF parameters can be calculated as well. The THD, DPF and/or the PF can be calculated as described herein (without resort to use of an FFT).

Figure 6:
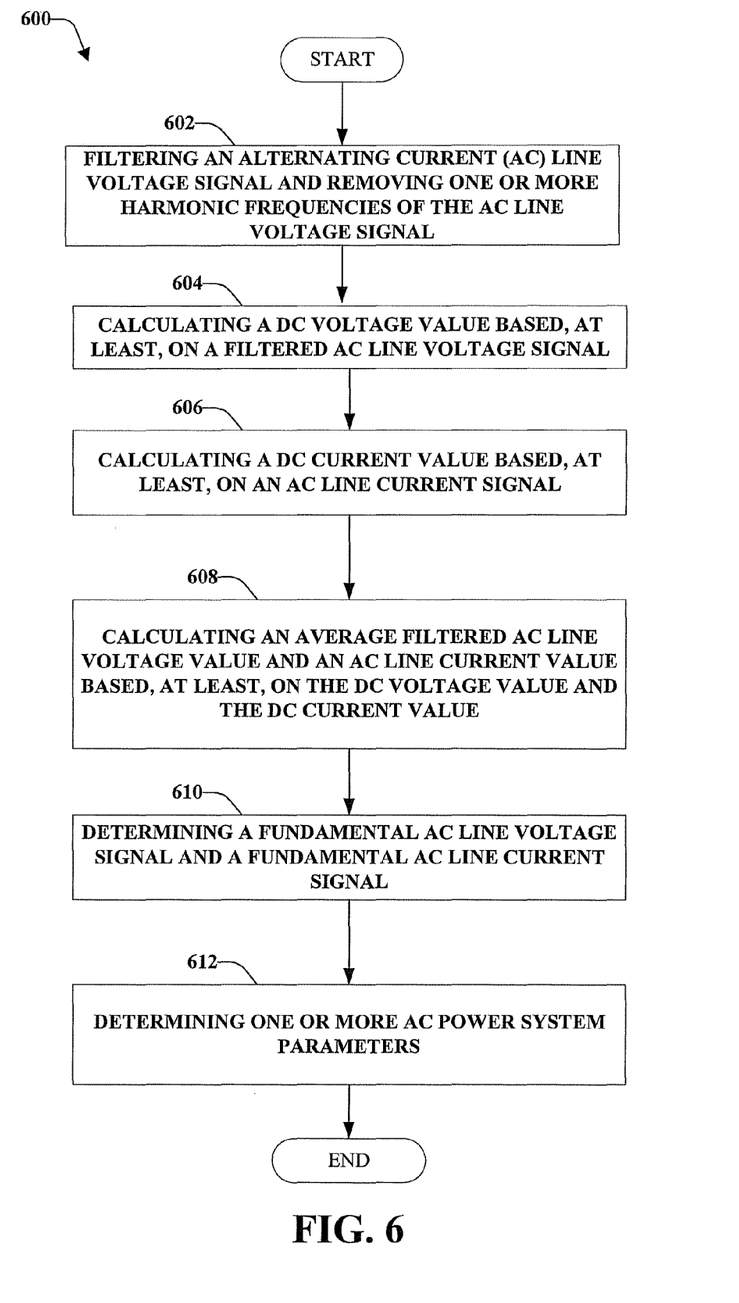
FIGS. 6 and 7 are illustrations of exemplary flow diagrams of methods that can facilitate AC power system monitoring and parameter determination according to implementations described herein.
Figure 7:
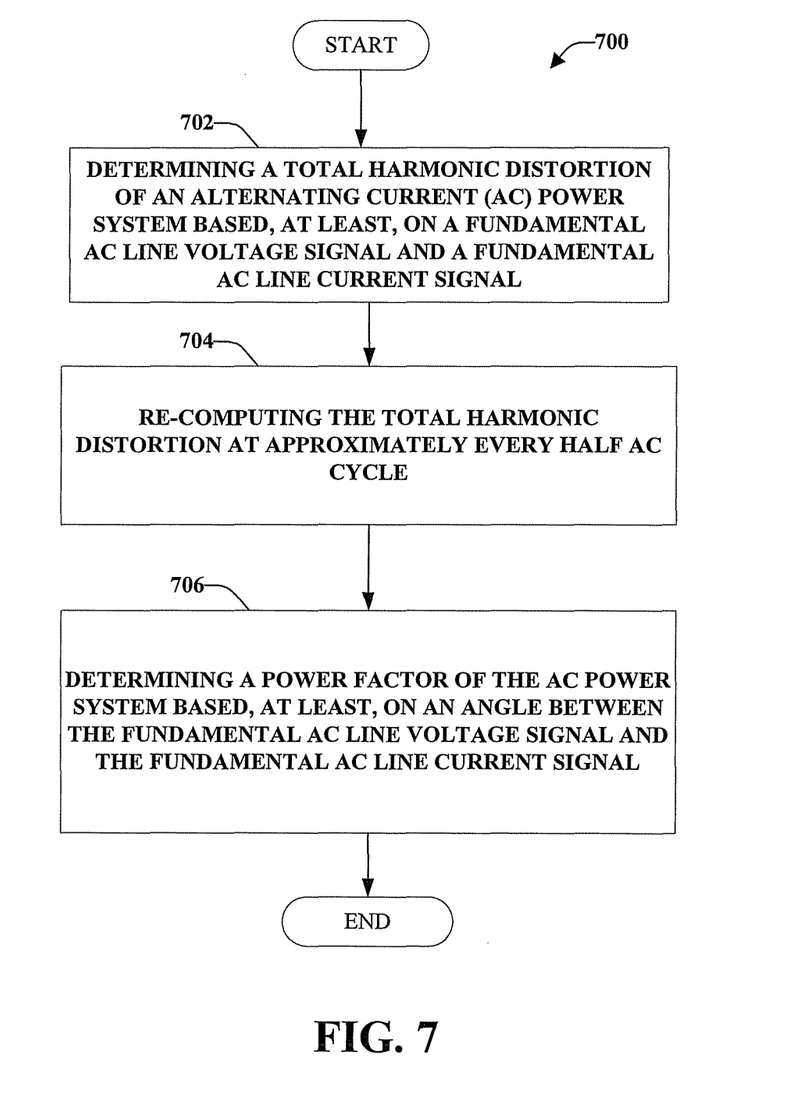

FIGS. 6 and 7 are illustrations of exemplary flow diagrams of methods that can facilitate AC power system monitoring and parameter determination according to implementations described herein. The methods 600 and 700 can include employing at least one processor executing computer-executable instructions. The computer-executable instructions can be embodied on at least one non-transitory computer-readable medium to perform the operations described for methods 600 and 700.

Turning first to FIG. 6, at 602, method 600 can include filtering an AC line voltage signal and removing one or more harmonic frequencies of the AC line voltage signal. The filtering can be performed by a LPF in some implementations.

At 604, method 600 can include calculating a DC voltage value based, at least, on a filtered AC line voltage signal. At 606, method 600 can include calculating a DC current value based, at least, on an AC line current signal.

At 608, method 600 can include calculating an average filtered AC line voltage value and an AC line current value based, at least, on the DC voltage value and the DC current value.

At 610, method 600 can include determining a fundamental AC line voltage signal and a fundamental AC line current signal. The determination can be performed at times corresponding to one or more zero crossings of the respective average filtered AC line voltage value and the average AC line current value. In some implementations, although not shown in FIG. 6, method 600 can also include re-calculating the average AC line voltage value and the AC line current value approximately every half AC cycle. As noted above, the average values can be DC values. These average values can be updated at every zero crossing in some embodiments, and at one or more zero crossings in other embodiments.

At 612, method 600 can include determining one or more AC power system parameters. The AC power system parameters can be based, at least, on the fundamental AC line voltage signal and the fundamental AC line current signal.

In some embodiments, although not shown, power control policy decisions can be made based on the AC power system parameters. In some embodiments, power can be provided to servers of a data center based on the AC power system parameters.

Turning now to FIG. 7, at 702, method 700 can include determining a total harmonic distortion of an AC power system based, at least, on a fundamental AC line voltage signal and a fundamental AC line current signal. At 704, method 700 can include re-computing the total harmonic distortion at approximately every half AC cycle. In some implementations, although not shown, method 700 can also include determining a power factor of the AC power system. The power factor can be based on the angle between the fundamental AC line voltage signal and the fundamental AC line current signal.

In some embodiments, although not shown, policy decisions can be made and/or power can be provided to one or more servers, based on the total harmonic distortion and/or the power factor.

In various implementations, parameters for three phase AC power systems can be determined based on the monitoring and calculation methodologies and devices provided herein. In these implementations, the devices and methodologies provided above can be provided for two or more phases of a three phase AC power system. For example, the devices and methodologies provided above can be provided for each of the three phases of a three phase AC power system. In some implementations, for each phase of the three phases, AC line voltage signals can be filtered and corresponding values can be averaged, the AC line current value can also be averaged. The fundamental AC line voltage can be obtained and the fundamental AC line current can be obtained. The THD, DPF and/or the PF can be calculated as described herein (without resort to use of an FFT).

Implementations described herein can be designed as centralized or distributed computing environments. For example, the microcontroller 109, calculation component 112, averaging component 114 and/or the filtering component 116 can be included in or be designed as either a centralized computing environment or a distributed computing environment. With regard to distributed computing environments, there are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems as described in various implementations.

Computing devices performing one or more functions described herein (the averaging or filtering functions and/or the detection of zero crossings, for example). These computing devices can typically include a variety of computer readable media, or computer storage media. The computer storage media can be in the form of volatile and/or nonvolatile memory such as read only memory (ROM) and/or random access memory (RAM). By way of example, and not limitation, memory can also include an operating system, application programs, other program modules, and program data. Computing devices typically include a variety of media, which can include computer-readable storage media and/or communications media, in which these two terms are used herein differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, electrically erasable programmable read only memory (EEPROM), flash memory or other memory technology, compact disc read only memory (CD-ROM), digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

On the other hand, communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, radio frequency (RF), infrared and other wireless media.

It is to be understood that the techniques described herein can be implemented in hardware, software, firmware, middleware, microcode, or any combination thereof. For example, the calculation component 112 and/or the averaging component 114 can be implemented by software, hardware or firmware. As another example, the techniques described with reference to FIGS. 6 and 7 can be implemented by software, hardware or firmware. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, microcontrollers (e.g., microcontroller 109), microprocessors and/or other electronic units designed to perform the functions described herein, or a combination thereof.

When the techniques are implemented in software, firmware, middleware or microcode, program code or code segments, they can be stored in a machine-readable medium (or a computer-readable storage medium), such as a storage component. A code segment can represent a procedure, a function, a subprogram, a program, a routine, a subroutine, a module, a software package, a class, or any combination of instructions, data structures, or program statements. A code segment can be coupled to another code segment or a hardware circuit by passing and/or receiving information, data, arguments, parameters, or memory contents. Information, arguments, parameters, data, etc. can be passed, forwarded, or transmitted using any suitable means including memory sharing, message passing, token passing, network transmission, etc.

For a software implementation, the techniques described herein can be implemented with modules or components (e.g., procedures, functions, and so on) that perform the functions described herein. The software codes can be stored in memory units and executed by processors. A memory unit can be implemented within the processor or external to the processor, in which case it can be communicatively coupled to the processor via various means as is known in the art.

The word "exemplary" is used herein to mean serving as an example, instance, or illustration. For the avoidance of doubt, the subject matter disclosed herein is not limited by such examples. In addition, any aspect or design described herein as "exemplary" is not necessarily to be construed as preferred or advantageous over other aspects or designs, nor is it meant to preclude equivalent exemplary structures and techniques known to those of ordinary skill in the art. Furthermore, to the extent that the terms "includes," "has," "contains," and other similar words are used in either the detailed description or the claims, for the avoidance of doubt, such terms are intended to be inclusive in a manner similar to the term "comprising" as an open transition word without precluding any additional or other elements.

What has been described above includes examples of one or more implementations. It is, of course, not possible to describe every conceivable combination of components or methodologies for purposes of describing the aforementioned implementations, but one of ordinary skill in the art can recognize that many further combinations and permutations of various implementations are possible. Accordingly, the described implementations are intended to embrace all such alterations, modifications and variations that fall within the spirit and scope of the appended claims.

The aforementioned systems have been described with respect to interaction between several components. For example, the averaging component 114, the calculation component 112 and/or the filtering component 116. It can be appreciated that such systems and components can include those components or specified sub-components, and/or additional components, and according to various permutations and combinations of the foregoing. Sub-components can also be implemented as components communicatively coupled to other components rather than included within parent components (hierarchical). Additionally, it is to be noted that one or more components can be combined into a single component providing aggregate functionality or divided into several separate sub-components. For example, the microcontroller 109 can be composed of the averaging component 114, the filtering component 116 and the calculation component 112. Additionally, any components described herein can also interact with one or more other components not specifically described herein but generally known by those of skill in the art.

In view of the exemplary systems described above methodologies that can be implemented in accordance with the described subject matter will be better appreciated with reference to the flowcharts of the various figures. While for purposes of simplicity of explanation, the methodologies of FIGS. 6 and 7 are shown and described as a series of blocks, it is to be understood and appreciated that such subject matter is not limited by the order of the blocks, as some blocks can occur in different orders and/or concurrently with other blocks from what is depicted and described herein.

In addition to the various implementations described herein, it is to be understood that other similar implementations can be used or modifications and additions can be made to the described implementations for performing the same or equivalent functions of the corresponding implementations without deviating therefrom. Still further, multiple processing chips or multiple devices can share the performance of one or more functions described herein, and similarly, storage can be effected across a plurality of devices. The inventions are not to be limited to any single implementation, but rather can be construed in breadth, spirit and scope in accordance with the appended claims.

What is claimed is:

1. A device, comprising:
   at least one processor; and
   at least one non-transitory computer-readable medium communicatively coupled to the at least one processor, the at least one non-transitory computer-readable medium having stored therein computer-executable instructions for implementing:
      an alternating current (AC) power system monitor configured to:
      sense an AC line current signal provided by a power system;
      filter an AC line voltage signal to remove one or more harmonic frequencies of the AC line voltage signal;
      determine one or more zero crossings of the filtered AC line voltage signal;
      determine a direct current (DC) current value for the AC line current signal provided by the power system based, at least in part, on the filtered AC line voltage signal and the one or more zero crossings;
      determine an active power current value for the AC line current signal provided by the power system and a power factor current value for the AC line current signal provided by the power system based, at least in part, on the determined DC current value;
      determine a fundamental AC line current signal for the AC line current signal provided by the power system based, at least in part, on a sum of an average of the active power current value for the AC line current signal provided by the power system and an average of the power factor current value for the AC line current signal provided by the power system;
      determine one or more AC power system parameters for the AC line current signal provided by the power system based, at least in part, on the determined fundamental AC line current signal; and
      adjust AC power provided by the power system based, at least in part, on the one or more determined AC power system parameters.

2. The device of claim 1, wherein at least one of the one or more AC power system parameters is a total harmonic distortion (THD) of an AC power system.

3. The device of claim 2, wherein the AC power system monitor is configured to determine the THD based on the fundamental AC line current signal and a fundamental AC line voltage signal.

4. The device of claim 1, wherein at least one of the one or more AC power system parameters is a power factor of an AC power system.

5. The device of claim 4, wherein the AC power system monitor is further configured to determine the power factor based on an angle between the fundamental AC line current signal and a fundamental AC line voltage signal.

6. The device of claim 4, wherein the power factor is a displacement power factor.

7. The device of claim 6, wherein the power factor is a function of the displacement power factor, the fundamental AC line current signal and a fundamental AC line voltage signal.

8. The device of claim 1, wherein the AC power system monitor is configured to filter the one or more harmonic frequencies of the AC line voltage signal via a low pass filter.

9. The device of claim 1, wherein the AC power system monitor is further configured to re-determine the active power current value and the power factor current value every half AC cycle.

10. A method, comprising:
    employing at least one processor executing computer-executable instructions embodied on at least one non-transitory computer-readable medium to perform operations comprising:
       sense an AC line current signal provided by a power system;
       filter an AC line voltage signal to remove one or more harmonic frequencies of the AC line voltage signal;
       determine one or more zero crossings of the filtered AC line voltage signal;
       determine a direct current (DC) current value for the AC line current signal provided by the power system based, at least in part, on the filtered AC line voltage signal and the one or more zero crossings;
       determine an active power current value for the AC line current signal provided by the power system and a power factor current value for the AC line current signal provided by the power system based, at least in part, on the determined DC current value;
       determine a fundamental AC line current signal for the AC line current signal provided by the power system based, at least in part, on a sum of an average of the active power current value for the AC line current signal provided by the power system and an average of the power factor current value for the AC line current signal provided by the power system;
       determine one or more AC power system parameters for the AC line current signal provided by the power system based, at least in part, on the determined fundamental AC line current signal; and adjust AC power provided by the power system based, at least in part, on the one or more determined AC power system parameters.

11. The method of claim 10, wherein determining the one or more AC power system parameters comprises determining a total harmonic distortion (THD) of an AC power system.

12. The method of claim 11, wherein the THD is based on the fundamental AC line current signal and a fundamental AC line voltage signal.

13. The method of claim 10, wherein determining the one or more AC power system parameters comprises determining a power factor of an AC power system.

14. The method of claim 13, wherein determining the power factor of an AC power system is based on an angle between the fundamental AC line current signal and a fundamental AC line voltage signal.

15. The method of claim 13, wherein the power factor is a displacement power factor.

16. The method of claim 15, wherein the power factor is a function of the displacement power factor, the fundamental AC line current signal and a fundamental AC line voltage signal.

17. The method of claim 10, wherein filtering the AC line voltage signal and removing one or more harmonic frequencies of the AC line voltage signal is performed via a low pass filter.

18. The method of claim 10, further comprising re-determining the active power current value and the power factor current value every half AC cycle.

19. The method of claim 10, further comprising controlling power provided to one or more servers based, at least, on the one or more AC system parameters.

20. The method of claim 10, further comprising generating one or more power control policy decisions for one or more servers based, at least, on the one or more AC system parameters.

* * * * *